United States Patent
Gronheid et al.

(10) Patent No.: US 10,186,459 B2
(45) Date of Patent: Jan. 22, 2019

(54) SELECTIVE FIN CUT

(71) Applicant: IMEC VZW, Leuven (BE)

(72) Inventors: Roel Gronheid, Huldenberg (BE); Vladimir Machkaoutsan, Wezemaal (BE)

(73) Assignee: IMEC VZW, Leuven (BE)

( * ) Notice: Subject to any disclaimer, the term of this patent is extended or adjusted under 35 U.S.C. 154(b) by 4 days.

(21) Appl. No.: 15/704,837

(22) Filed: Sep. 14, 2017

(65) Prior Publication Data

US 2018/0076092 A1 Mar. 15, 2018

(30) Foreign Application Priority Data

Sep. 15, 2016 (EP) .................................. 16189054

(51) Int. Cl.
| | | |
|---|---|---|
| *H01L 21/82* | (2006.01) | |
| *H01L 21/8234* | (2006.01) | |
| *H01L 21/308* | (2006.01) | |
| *H01L 21/306* | (2006.01) | |
| *H01L 21/762* | (2006.01) | |
| *H01L 21/02* | (2006.01) | |
| *G03F 7/00* | (2006.01) | |
| *H01L 29/66* | (2006.01) | |

(52) U.S. Cl.
CPC .... *H01L 21/823431* (2013.01); *G03F 7/0002* (2013.01); *H01L 21/02118* (2013.01); *H01L 21/02356* (2013.01); *H01L 21/3081* (2013.01); *H01L 21/3086* (2013.01); *H01L 21/30604* (2013.01); *H01L 21/76224* (2013.01); *H01L 21/823481* (2013.01); *H01L 29/66795* (2013.01)

(58) Field of Classification Search
CPC ....................... H01L 21/02118; H01L 21/3081
See application file for complete search history.

(56) References Cited

U.S. PATENT DOCUMENTS

| | | | |
|---|---|---|---|
| 7,790,350 B2 * | 9/2010 | Breyta | B82Y 10/00 |
| | | | 430/270.1 |
| 8,790,522 B1 | 7/2014 | Schmid et al. | |
| 9,209,037 B2 | 12/2015 | Cantone et al. | |
| 9,252,022 B1 | 2/2016 | Dechene et al. | |
| 9,343,370 B1 | 5/2016 | Lee et al. | |
| 9,466,534 B1 * | 10/2016 | Brink | H01L 21/823431 |
| 9,536,750 B1 * | 1/2017 | Chi | H01L 21/3086 |
| 9,659,824 B2 * | 5/2017 | Cheng | H01L 21/823431 |
| 9,659,942 B1 * | 5/2017 | Basker | H01L 27/1104 |
| 10,059,820 B2 * | 8/2018 | Brink | C08J 7/047 |

(Continued)

FOREIGN PATENT DOCUMENTS

| | | |
|---|---|---|
| EP | 2 988 322 A1 | 2/2016 |
| EP | 3 062 334 A1 | 8/2016 |

OTHER PUBLICATIONS

European Search Report, European Patent Application No. 16189054.6 dated Feb. 28, 2017, 9 pages.

*Primary Examiner* — Caridad Everhart
*Assistant Examiner* — Ankush Singal
(74) *Attorney, Agent, or Firm* — McDonnell Boehnen Hulbert & Berghoff LLP

(57) ABSTRACT

The present disclosure relates to methods and structures that involve the use of directed self-assembly to selectively remove at least one fin or fin section from a pattern of parallel fins in a semiconductor structure.

18 Claims, 8 Drawing Sheets

(56) References Cited

U.S. PATENT DOCUMENTS

| | | | |
|---|---|---|---|
| 2009/0026543 A1* | 1/2009 | Yang | H01L 21/845 257/365 |
| 2009/0191713 A1* | 7/2009 | Yoon | B81C 1/00031 438/703 |
| 2014/0134844 A1 | 5/2014 | Tegen et al. | |
| 2014/0287083 A1* | 9/2014 | Gao | G03F 7/0035 425/385 |
| 2014/0353762 A1* | 12/2014 | Guillorn | H01L 27/0886 257/390 |
| 2014/0377965 A1 | 12/2014 | Schmid et al. | |
| 2015/0195916 A1* | 7/2015 | Cheng | G03F 7/0002 216/47 |
| 2016/0056045 A1 | 2/2016 | Huang et al. | |
| 2016/0071929 A1* | 3/2016 | Bentley | B82Y 10/00 257/401 |
| 2016/0122859 A1* | 5/2016 | Cushen | C23C 14/042 216/49 |
| 2016/0225635 A1 | 8/2016 | Lee et al. | |
| 2016/0238933 A1 | 8/2016 | Su et al. | |
| 2016/0342089 A1* | 11/2016 | Ruiz | G03F 7/0002 |

* cited by examiner

SELECTIVE FIN CUT

CROSS-REFERENCE TO RELATED APPLICATIONS

The present application is a non-provisional patent application claiming priority to European Patent Application No. 16189054.6, filed on Sep. 15, 2016, the contents of which are hereby incorporated by reference.

FIELD OF THE DISCLOSURE

The present disclosure relates to semiconductor structures and particularly to removing fins or fin sections in such structures.

BACKGROUND

In the fabrication of semiconductor devices, such as fin field effect transistors (FinFETs), there is typically a need to etch identical fins at well-defined locations in the wafer. However, if the final fin pattern is directly formed in the wafer by using a hard mask presenting that same pattern, not all fins etched in the wafer through that hard mask will be identical. For instance, when a fin pattern comprising several groups of closely packed fins is first defined in a hard mask and then transferred into the wafer, the fins at the edges of a group will etch differently than the inner fins of the group. One method commonly used to get around this issue is to first form a large group of closely packed parallel fins in a wafer via a matching hard mask, followed by selectively removing from that large group all fins that do not belong to the final fin pattern. This way, the problem is limited to the edge of the large group only.

Such fin removal, which is for example described in U.S. Pat. No. 9,209,037B2, is challenging due to the very small fin pitch that is present for advanced nodes. Not only does this impose stringent conditions on the mask pattern that needs to be formed; the cut lithography additionally becomes very challenging in terms of the overlay requirements, where small overlay errors may remove desired fins and/or leave parts of undesired fins. This results in increasing patterning costs as scaling is further increased, requiring for example expensive EUV or 193i multi-patterning techniques.

As such, there is still a need for improved methods of removing undesired fins.

SUMMARY

The present disclosure provides methods and structures for removing fins or fin sections from a pattern of parallel fins.

Some embodiments may allow for a tight pitched mask pattern to be obtained and used to remove fins or fin sections.

Some embodiments may allow the mask pattern to be self-aligned to the underlying layer, thereby overcoming potential overlay issues.

Some embodiments may allow the mask patterns to be used to remove entire fins or to interrupt fins over their length.

Some embodiments may allow the mask pattern to be applied at a multitude of stages during the formation of semiconductor fins.

Some embodiments may allow different groups of fins on the same substrate to be patterned differently.

In a first aspect, the present disclosure relates to a method for selectively removing at least one fin or fin section from a pattern of parallel fins in a semiconductor structure, comprising:

providing a substrate having a pattern of parallel fins thereon, the pattern of parallel fins having a first pitch, the fins having co-planar top surfaces and being separated by a filling material having a top surface coplanar with the top surfaces of the fins;

providing through directed self-assembly a layer of self-assembled block copolymer covering the top surfaces of the fins and of the filling material, the self-assembled block copolymer comprising a regular pattern of parallel lines of a first phase alternating with parallel lines of a second phase, the pattern of parallel lines of the first and second phase having a second pitch equal to an integer multiple of the first pitch, the parallel lines of the first phase and the parallel lines of the second phase each being at least as wide as the top surface of the fins and being parallel to the fins;

removing the lines of the first phase selectively with respect to the lines of the second phase, thereby selectively uncovering the top surfaces of the at least one fin or fin section to be removed and the top surface of some of the filling material (while leaving at least one other fin or fin section covered by the lines of the second phase); and etching away the at least one uncovered fin or fin section and the uncovered filling material by using the lines of the second phase as a mask, thereby leaving voids where the at least one uncovered fin or fin section and the uncovered filling material was present.

In a second aspect, the present disclosure relates to a structure comprising:

a substrate having a pattern of parallel fins thereon, the pattern of fins having a first pitch, the fins having co-planar top surfaces and being separated by a filling material having a top surface coplanar with the top surface of the fins;

a layer of self-assembled block copolymer covering the top surfaces of the fins and of the filling material, the self-assembled block copolymer comprising a regular pattern of lines of a first phase alternating with lines of a second phase, the pattern of lines of the first and second phases having a second pitch equal to an integer multiple of the first pitch, the parallel lines of the first phase and the parallel lines of the second phase each being at least as wide as the top surface of the fins and being parallel to the fins.

In a third aspect, the present disclosure relates to a use of directed self-assembly for selectively removing at least one fin or fin section from a pattern of parallel fins in a semiconductor structure.

In a fourth aspect, the present disclosure relates to the use of a self-assembling block copolymer for selectively removing at least one fin or fin section in a pattern of parallel fins in a semiconductor structure.

Some aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1:
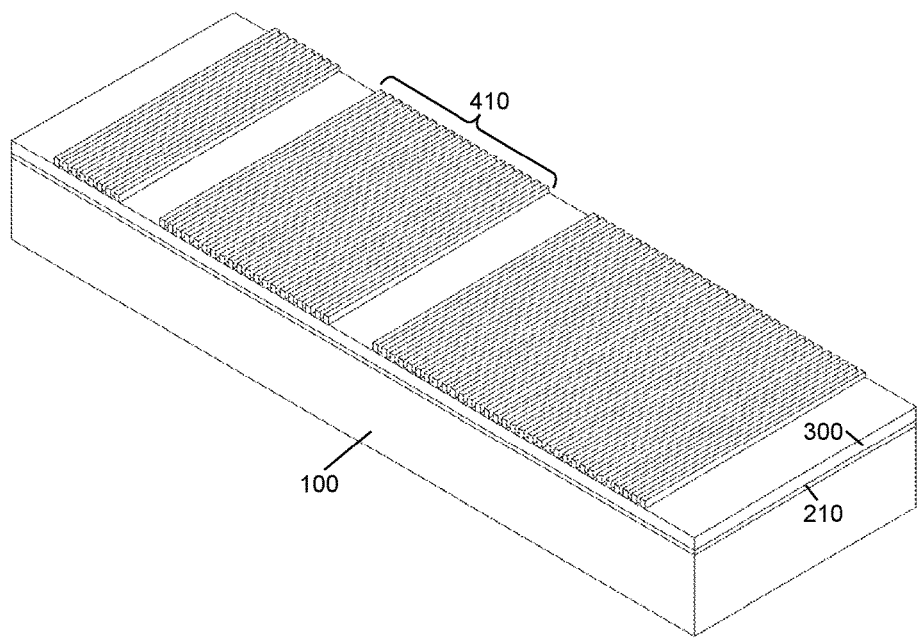
FIGS. 1 to 4 depict simplified perspective views of the end result of different steps in the implementation of a method for forming a fin pattern, according to example embodiments.

In the different figures, the same reference signs refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claims require more features than are expressly recited in each claim. Rather, as the following claims reflect, some aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that some embodiments may be practiced without these specific details. In other instances, well-known methods, structures and techniques have not been shown in detail in order not to obscure an understanding of this description.

The following terms are provided solely to aid in the understanding of the disclosure.

As used herein and unless provided otherwise, the term "fin" refers to an elongated structure extending upwards from a surface, e.g. a top surface of a substrate. A fin may typically have a length, a width and a height, wherein the length and width are respectively the longest and shortest dimensions of the fin parallel to the surface and wherein the height is the dimension perpendicular to the surface. For example, a fin may have a length of 10 to 500 nm, a width of 5 to 20 nm and a height of 10 to 100 nm.

As used herein, a "fin section" is a portion of the fin along its longitudinal direction, i.e. a portion having the same width and height as the fin but a length equal to a fraction of the fin length. An entire fin may then be thought of as being comprised of a plurality of adjacent fin sections.

As used herein, "directed self-assembly" is a process in which the self-assembly of material is guided by a stimulus which is external to the material. For example, a self-assembled block copolymer comprising two phases may be formed on a surface comprising a pattern of two zones, wherein one of the phases has a preferential interaction (e.g. a preferential wetting affinity) with one of the zones. The preferential interaction may then direct the self-assembly of the self-assembling block copolymer in such a way that the contact area between the one of the phases and the one of the zones is maximized.

In a first aspect, the present disclosure relates to a method for selectively removing at least one fin or fin section from a pattern of parallel fins in a semiconductor structure, comprising:
  a. providing a substrate having a pattern of parallel fins thereon, the pattern of parallel fins having a first pitch, the fins having co-planar top surfaces and being separated by a filling material having a top surface coplanar with the top surfaces of the fins;
  b. providing through directed self-assembly a layer of self-assembled block copolymer covering the top surfaces of the fins and of the filling material, the self-assembled block copolymer comprising a regular pattern of parallel lines of a first phase alternating with parallel lines of a second phase, the pattern of parallel lines of the first and second phase having a second pitch equal to an integer multiple of the first pitch, the parallel lines of the first phase and the parallel lines of the second phase each being at least as wide as the top surface of the fins and being parallel to the fins;
  c. removing the lines of the first phase selectively with respect to the lines of the second phase, thereby selectively uncovering the top surfaces of the at least one fin or fin section to be removed and the top surface of some of the filling material (while leaving at least one other fin or fin section covered by the lines of the second phase); and
  d. etching away the at least one uncovered fin or fin section and the uncovered filling material by using the lines of the second phase as a mask, thereby leaving voids where the at least one uncovered fin or fin section and the uncovered filling material was present.

The fins on the substrate may originate from the patterning of one or more layers present on the substrate, from the patterning of the substrate itself or from a combination of both.

In example embodiments, obtaining the pattern of parallel fins could be provided by using self-aligned quadruple patterning (SAQP). In one example, a layer of oxide material (e.g. $SiO_2$) and a layer of hardmask material (e.g. SiN) may be present on a semiconductor substrate (e.g. Si) and the fins may first be patterned in the hardmask material by etching the hardmask through a SAQP spacer pattern. Then, the hardmask pattern can be transferred into the oxide material and finally into the semiconductor material. Subsequently, the SAQP spacer pattern can be removed. In some embodiments, the present disclosure can be practiced at various stages in this example, starting by filling up any of the fin patterns with the filling material, thereby performing step a. As such, depending on which stage is being practiced, the fins may have an accordingly different composition: they may for instance comprise spacer material, hardmask material and oxide material but no semiconductor material (before transferring the pattern from the hardmask); spacer material, hardmask material, oxide material and semiconductor material (after transferring the pattern from the hardmask into the layer of semiconductor material); or hardmask material, oxide material, semiconductor material but no spacer material (after removing the remaining spacer material). In some embodiments, the fins may comprise a hardmask material, an oxide material and a semiconductor material. In some embodiments, the first pitch may range from 10 to 50 nm, 15 to 35 nm, 20 to 28 nm, or may be 24 nm.

The filling material, which may also be referred to as an isolation material, may for example be a dielectric material such as $SiO_2$. Providing the filling material may typically start from a pattern of parallel fins comprising voids between the fins, subsequently (over)filling the voids with the filling material, optionally densifying the filling material, and finally removing any overburden and planarizing the obtained structure, e.g. using chemical-mechanical polishing (CMP).

In some embodiments, providing a patterned layer of self-assembled block copolymer over the fins and over the filling material through directed self-assembly allows a tight pitched masking pattern to be formed which can self-align to the fin pattern, thereby overcoming conventional overlay issues. Direction of the self-assembly of self-assembling block copolymer is typically achieved by a difference between the first and second phase of the self-assembled block copolymer in their interaction, e.g. their wetting affinity, with the different zones (i.e. surface portions of different nature) the self-assembled block copolymer is provided on. In embodiments, the self-assembled block copolymer may be provided directly on top of the fins and filling material. In such a case, at least one of the first or second phase may have a preferential wetting affinity for the top surface of either the filling material or the fins. This preferential wetting affinity can for instance be due to the intrinsic chemical nature of the top surface of the filling material or fins. In other embodiments, a preferential wetting affinity can be achieved by modifying (e.g. functionalizing or coating) the top surface of the filling material or fin. The preferential affinity of one phase toward one zone (i.e one type of top surface: top surface of the fin or top surface of the filling material) may be achieved by increasing the wetting affinity toward that zone (i.e. that type of top surface) or by decreasing the wetting affinity toward the other zone (i.e. the other type of top surface), or both. Decreasing affinity toward one zone can be achieved for instance by functionalizing that zone with a random copolymer (called neutral brush) reactive toward that zone and having a same or similar ratio of monomers than the block copolymer, while increasing affinity of one phase of the block copolymer toward one zone can be achieved for instance by functionalizing that zone with a homopolymer (typically a cross-linked homopolymer) of the monomer making up that phase and reactive toward that zone.

Selectively removing the lines of the first phase of the self-assembled block copolymer so as to uncover (i.e. exposing the top surface of) at least one fin or fin section may typically be achieved by a selective etching of the first phase.

Selectively removing at least one uncovered fin section may typically be achieved by a selective etching of the uncovered fin. The removal is typically complete, i.e. the entire height of the fin section is removed.

In embodiments, step b may comprise:
providing a self-assembling block copolymer covering the top surfaces of the fins, and
inducing a phase separation of the first and second phase (thereby forming the self-assembled block copolymer).

Inducing a phase separation may for example be achieved by annealing the self-assembling block copolymer. In some examples, the self-assembling block copolymer is a material self-assembling into a lamellar structure.

In some embodiments, the self-assembling block copolymer may be poly(styrene-block-methyl methacrylate) (PS-b-PMMA). Many block copolymers are known to be amenable to directed self-assembly in a regular pattern. Furthermore, the pitch of this pattern and the width of each block can typically be controlled by adjusting the chain length of the polymer blocks. In embodiments, the regular pattern may be the lamellar structure of a self-assembling block copolymer.

In some embodiments, removing the at least one uncovered fin or fin section may consist of removing at least one complete fin. These embodiments allow fins to be removed from the pattern of fins; i.e. the period of the fin pattern can be altered. In some embodiments, the pattern of the first and second phase may be (self-) aligned to the pattern of fins; i.e. due to the self-assembly, the pattern of lines of the first and second phase aligns itself in such a way that the phase boundaries between the first and second phase is maximally present above the filling material (i.e. in between two fins). In some embodiments, the second pitch may be equal to an integer multiple of the first pitch. Such an integer multiple pitch difference permits both patterns to self-align such that at least one fin is present below each line and that each phase boundary is present above the filling material. In some embodiments, the second pitch may be at least twice the first pitch.

In embodiments, where n and m are integers, the method may be for removing m−n fins (or fin sections) on m fins (i.e. keeping n fin(s) on m) or for removing n fin(s) (or fin sections) on m fins (i.e. keeping m-n fins on m). In this embodiment, the second pitch may be m times the first pitch, the width of the lines of a first phase may be equal to m−n times the first pitch and the width of the lines of a second phase may be equal to n times the first pitch.

As an example, the method may be for removing two fins on three (i.e. keeping every third fin) or one fin on three (i.e. keeping two fins on three). In this example, the second pitch may be three times the first pitch, the width of the lines of a first phase may be equal to two times the first pitch, and the width of the lines of a second phase may be equal to the first pitch.

In embodiments, the pattern of fins may consist of an odd number of fins. An even number of fins typically leads to a situation where the pattern of lines of the first and second phase can self-align to the pattern of fins in two energetically degenerate ways. This degeneracy need not be present when the number of fins is odd.

In other embodiments, only one or more fin sections may be removed. These embodiments allow fins to be interrupted over their length; i.e. the length of a fin can be altered or a fin can be cut into two or more fins.

In embodiments, multiple patterns of fins, i.e. multiple groups of fins, may be present on the substrate and steps a to d may be performed multiple times. In these embodiments, the method may comprise an additional step a', before step b, of covering the fins with a mask and subsequently selecting at least one group of fins (or fin sections) by removing part of the mask above the group of fins (or fin sections). In this way, the self-assembled block copolymer can be provided only over the group of fins that is not covered by the mask, thereby allowing one to select one or more groups of fins on which to perform the embodiments disclosed above. As this typically involves a mask removal over a considerably larger area, as compared to removing fins or fin sections, this may typically be achieved using cruder lithographic techniques Applying the method multiple times on the same substrate, but each time to a selected set of fin groups, allows to fabricate a structure with a plurality of groups having a different fin period.

In a second aspect, the present disclosure relates to a structure comprising:
a. a substrate having a pattern of parallel fins thereon, the pattern of fins having a first pitch, the fins having co-planar top surfaces and being separated by a filling material having a top surface coplanar with the top surface of the fins;
b. a layer of self-assembled block copolymer covering the top surfaces of the fins and of the filling material, the self-assembled block copolymer comprising a regular pattern of lines of a first phase alternating with lines of a second phase, the pattern of lines of the first and second phases having a second pitch equal to an integer multiple of the first pitch, the parallel lines of the first phase and the parallel lines of the second phase each being at least as wide as the top surface of the fins and being parallel to the fins.

In embodiments, the pattern of the first and second phase may be aligned to the pattern of fins.

In embodiments, any feature of the second aspect and its embodiments may be as correspondingly described for the first aspect and its embodiments.

In a third aspect, the present disclosure relates to a use of directed self-assembly for selectively removing at least one fin or fin section from a pattern of parallel fins in a semiconductor structure.

In a fourth aspect, the present disclosure relates to the use of a self-assembling block copolymer for selectively removing at least one fin or fin section in a pattern of parallel fins in a semiconductor structure.

In embodiments, any feature of the third or fourth aspect and its embodiments may be as correspondingly described for the first aspect and its embodiments.

The disclosure will now be described by a detailed description of several embodiments. It is clear that other embodiments can be configured according to the knowledge of the person skilled in the art without departing from the true technical teaching of the disclosure, the disclosure being limited only by the terms of the appended claims.

Reference will be made to transistors. These are devices having a first main electrode such as a drain, a second main electrode such as a source and a control electrode such as a gate for controlling the flow of electrical charges between the first and second main electrodes.

Example 1 (Comparative): Creating a Fin Pattern, without Using DSA

An initial fin pattern (410) is formed and further processing steps are performed which result in a fin pattern (420) with the same pitch (p1) as the initial pattern (410).

We now refer to FIG. 1. A substrate (e.g. a Si wafer; 100) is provided having a dielectric layer (e.g. $SiO_2$; 210), a hardmask layer (e.g. SiN; 300) and an initial fin pattern (410) thereon. The initial fin pattern may for example be formed through a self-aligned quadruple patterning (SAQP) step.

Figure 2:
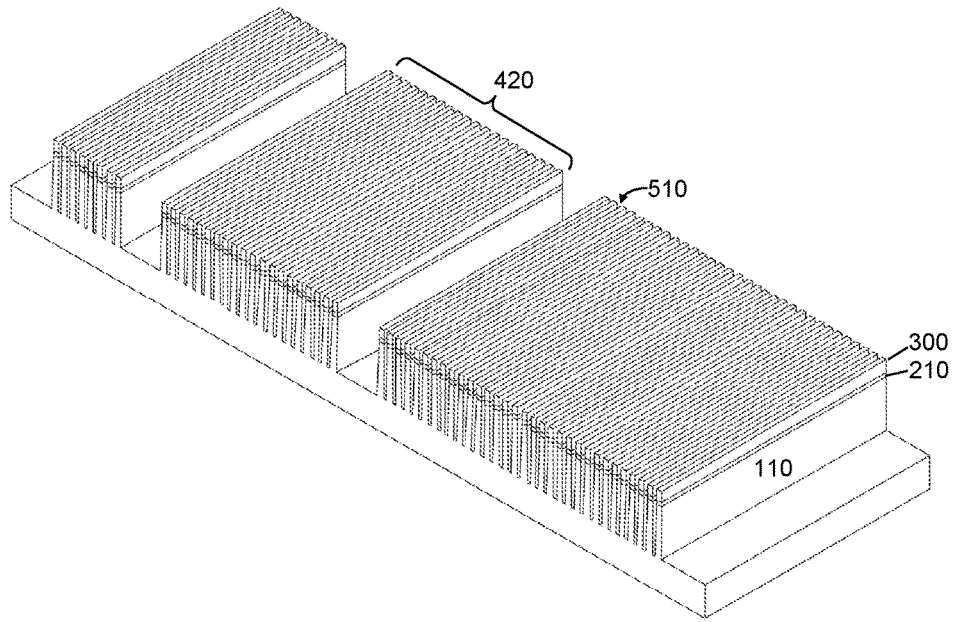

We now refer to FIG. 2. The initial fin pattern is transferred, through the hardmask (300) and dielectric layer (210), into the substrate (100) and the initial pattern material (410) is removed; leaving a series of voids (510) in between the fins. A second fin pattern (420) is thus formed, matching the first fin pattern (410); i.e. having the same pitch (p1). In this second fin pattern (420), each fin is made up of semiconductor material (110), dielectric material (210) and hardmask material (300).

Figure 3:
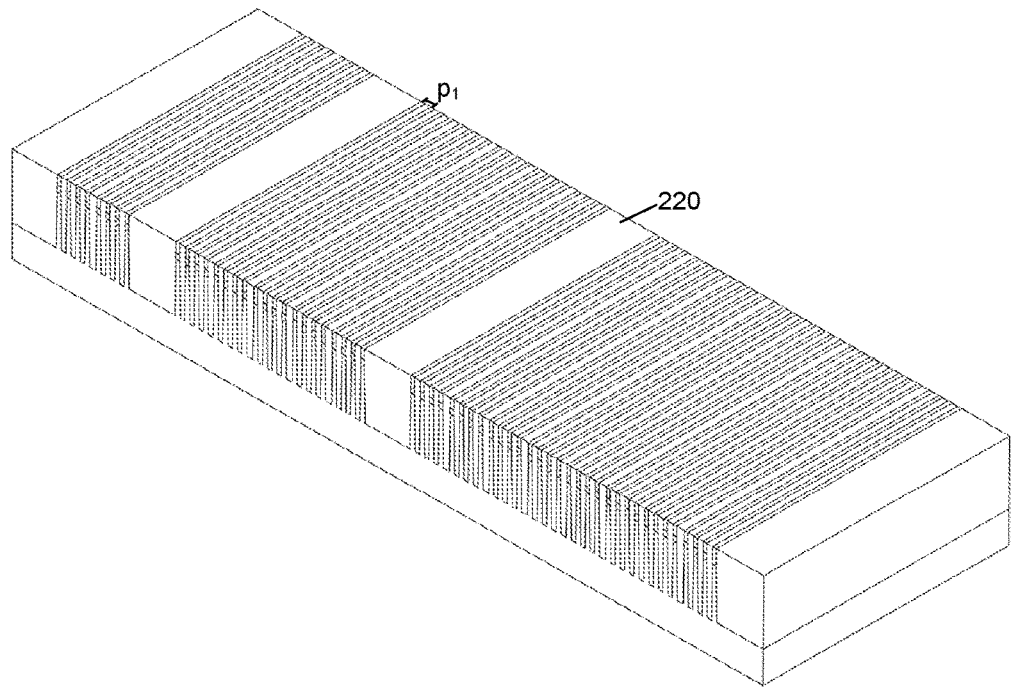

We now refer to FIG. 3. The voids (510) between the fins (420) are filled with a shallow trench isolation (STI) filling material (e.g. $SiO_2$; 220). An annealing step is subsequently applied to this filling material in order to densify it and any overburden is removed by planarizing the obtained structure in a chemical-mechanical polish (CMP) step.

Figure 4:
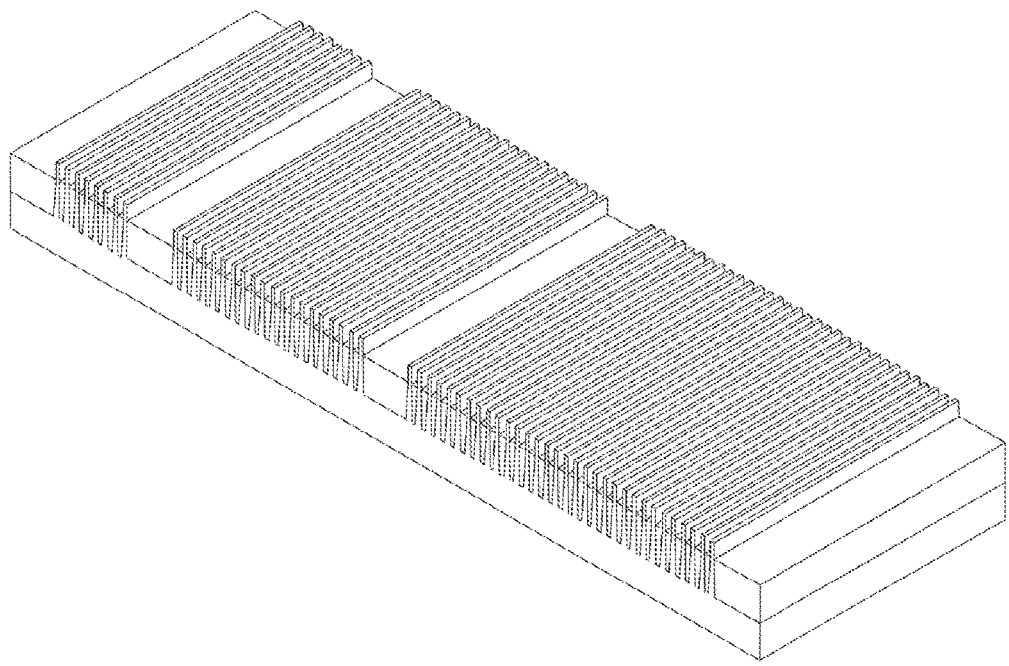

We now refer to FIG. 4. The filling material (220) is etched back so as to partially expose the fins (420). The fins (420) can then be further processed (not shown) to, for example, make fin field effect transistors.

Example 2: Creating an Altered Fin Pattern with DSA

The same pattern (420) of fins is formed as in FIG. 3 of example 1, but this time further processing steps include a directed self-assembly, according to an example embodiment. In this embodiment, the fin pattern (430) is altered to only keep every third fin.

Figure 5:
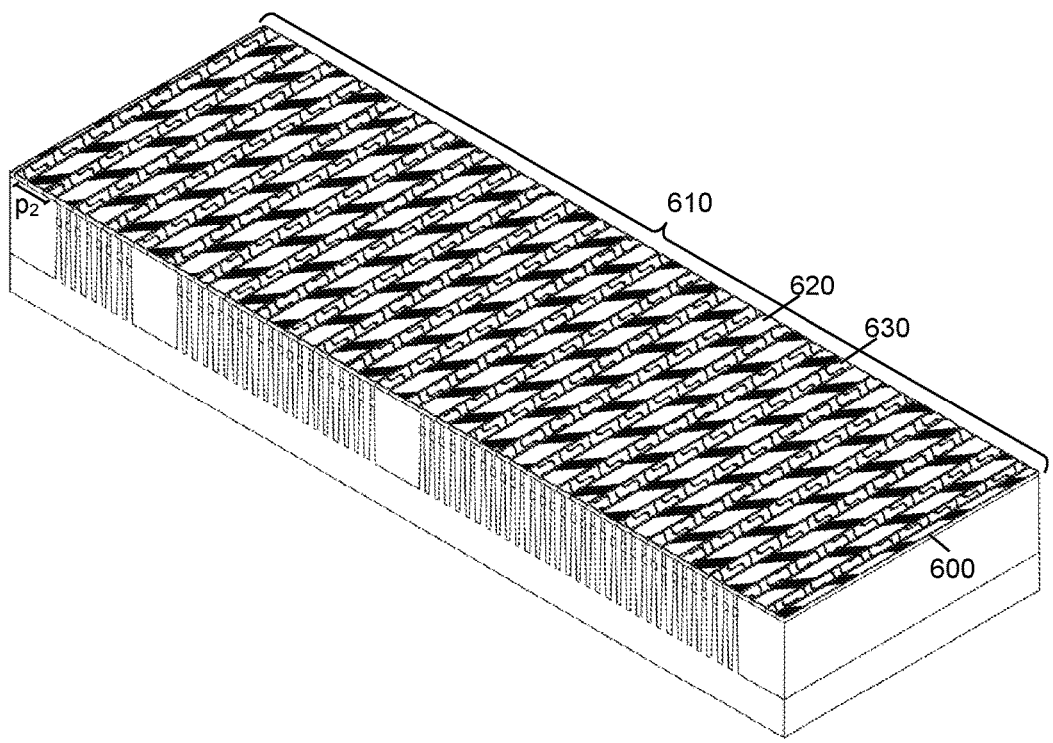
FIGS. 5 to 10 depict simplified perspective views of the end result of different steps in the implementation of a method for removing fins, according to example embodiments.

We now refer to FIG. 5. Starting from the structure in FIG. 3, a layer of self-assembling block copolymer (e.g. a block copolymer; 600) is provided on top of the fins (420) and filling material (220) and, through annealing, its phases are allowed to separate into a pattern of lines (610) of the first (620) and second (630) phase. The self-assembly of the self-assembling block copolymer (600) is directed by a preferential interaction of at least one of the phases (620 or 630) to either the top surface of the fins (420) or of the filling material (220). In this example, the pattern of lines (610) has a pitch (p2) which is three times higher than the fin pitch (p1) and the width of the lines is such that lines of a first phase (620) corresponds approximately to a width of two fin pitches and lines of a second phase (630) corresponds approximately to a width of a single fin pitch. Due to the preferential interaction, the pattern of lines (610) self-aligns so that each first phase (620) covers two fins and each second phase (630) covers one fin.

Figure 6:
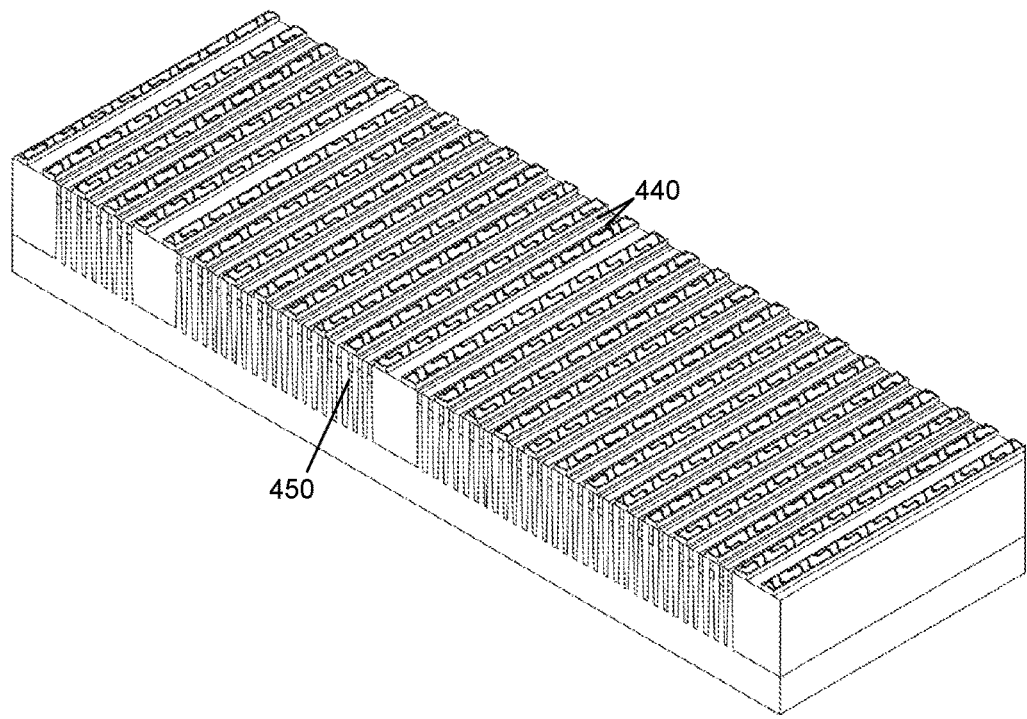

We now refer to FIG. 6. The lines of the first phase (620) are removed, selectively with respect to the second phase (630); thereby uncovering the two fins (440) beneath each line of first phase (620) and leaving every third fin covered (450).

Figure 7:
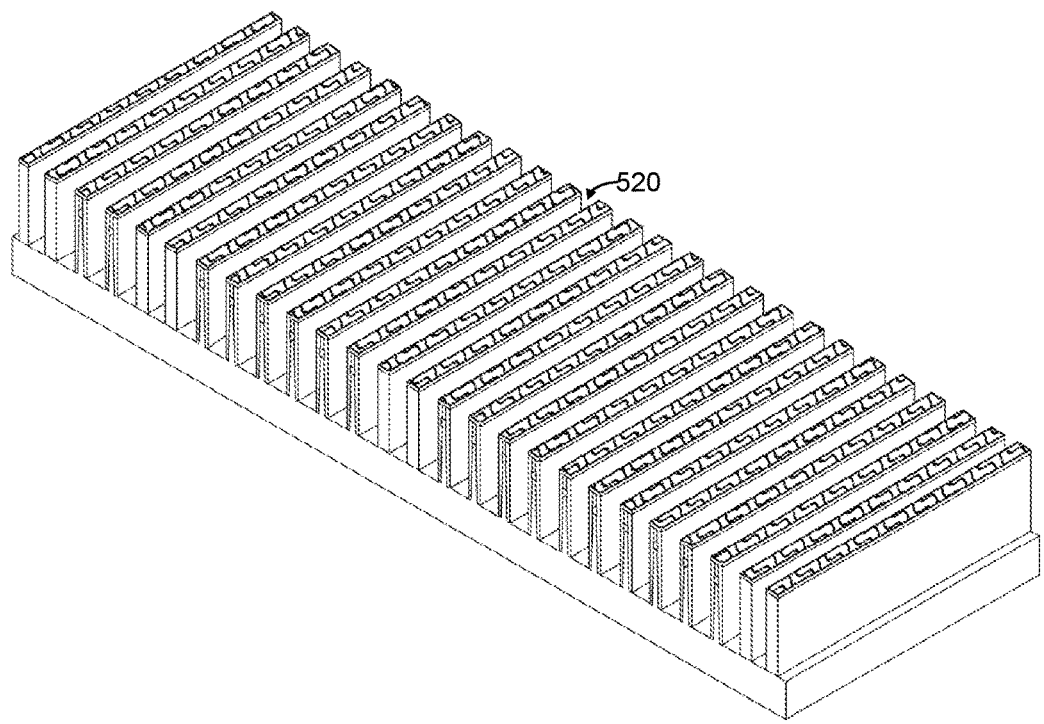

We now refer to FIG. 7. Using the lines of second phase (630) as an etch mask, the uncovered fins (440) and filling material (220) are removed leaving voids (520).

Figure 8:
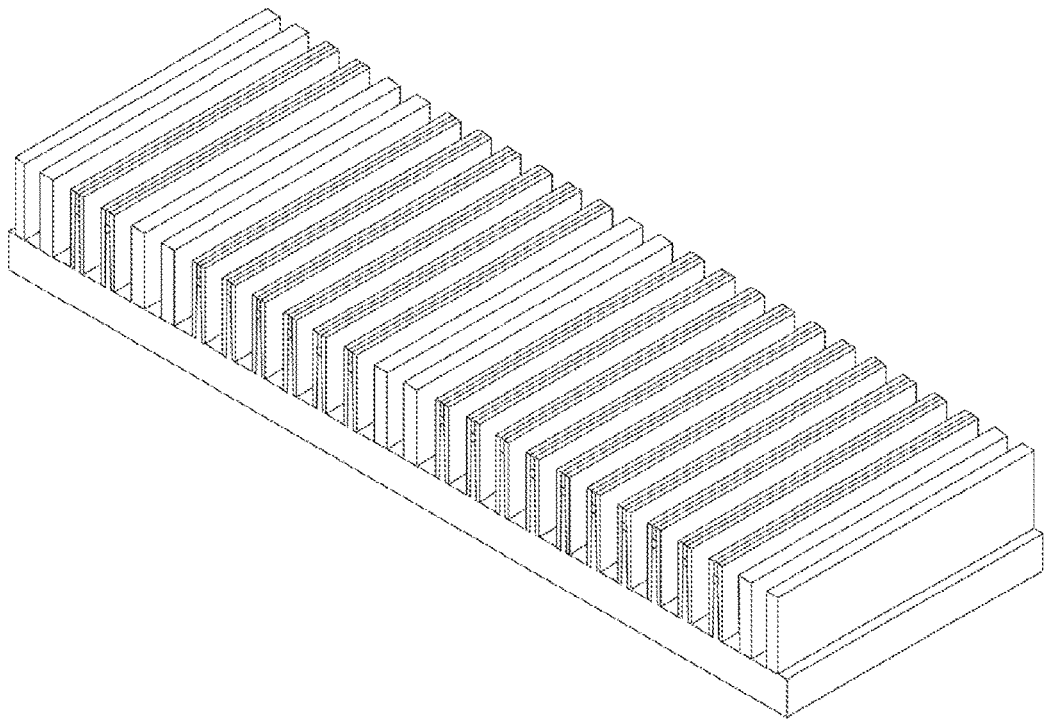

We now refer to FIG. 8. The lines of second phase (630) are removed, selectively with respect to the filling material (220) and the fins (450).

Figure 9:
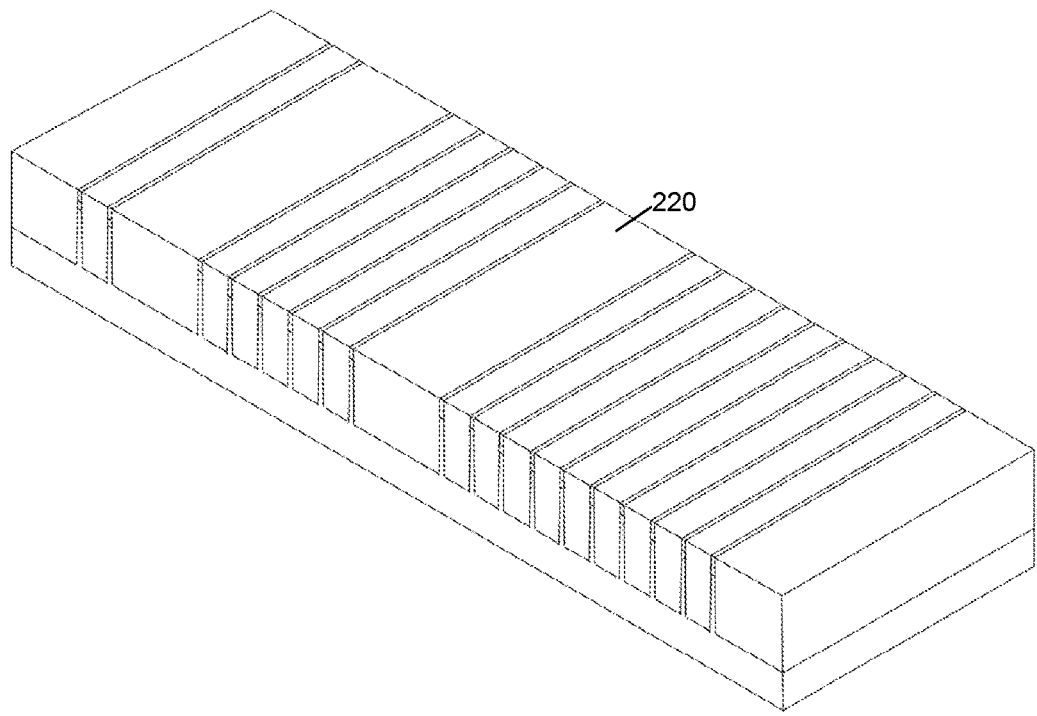

We now refer to FIG. 9. The voids (520) that are obtained by the removal in FIG. 7 are filled up with the filling material (220). Subsequently, some embodiments may again involve a planarization using CMP.

Figure 10:
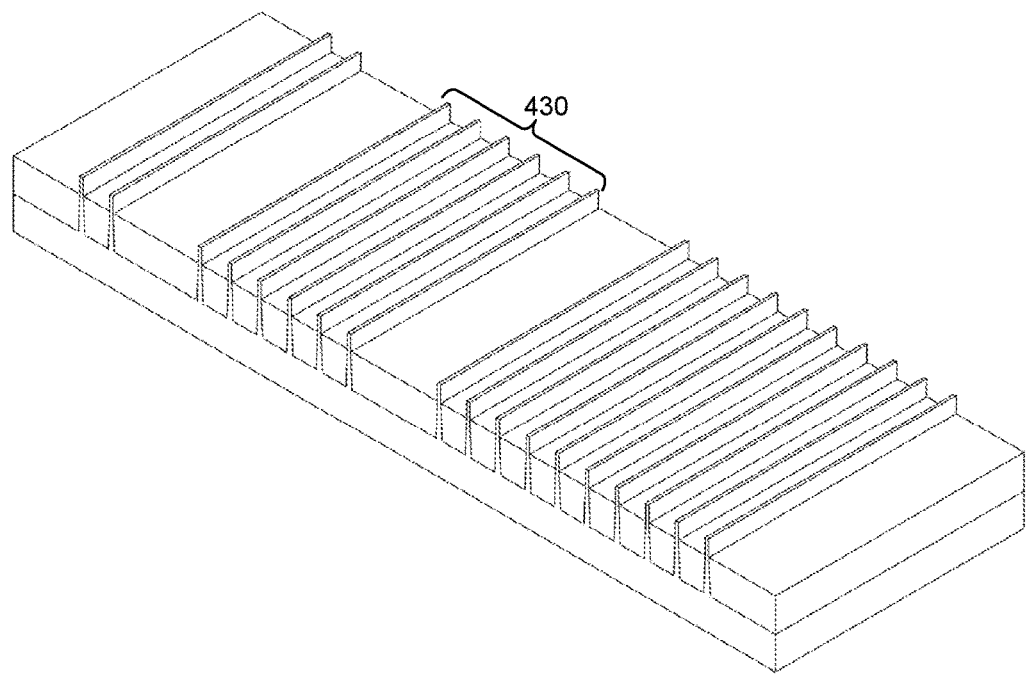

We now refer to FIG. 10. The filling material (220) is etched back so as to partially expose the fins (430). The pattern of fins (430) obtained differs from that in example 1 in that only one in every three fins (430) remains; i.e. the fin pitch is multiplied by three. The fins (430) can again be further processed (not shown) as explained in example 1.

Example 3: Creating an Alternative Altered Fin Pattern with DSA

Example 3 is similar to example 2, but in this case every third fin is removed.

Figure 11:
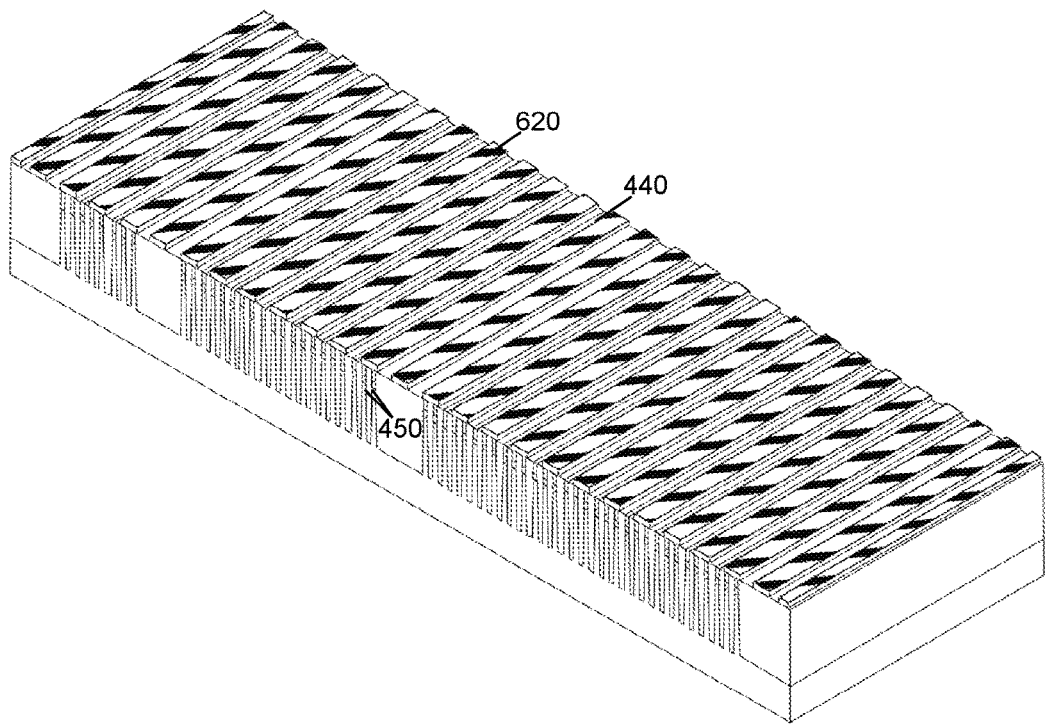
FIGS. 11 to 15 depict simplified perspective views of the end result of different steps in the implementation of a method for removing fins, according to example embodiments.

We now refer to FIG. 11. Starting from the structure in FIG. 5. The lines of the second phase (630) are now removed, as opposed to the lines of first phase (620) in example 2, selectively with respect to the first phase (620); thereby uncovering (440) the one fin beneath each line of second phase (630) and leaving the other fins covered (450).

Figure 12:
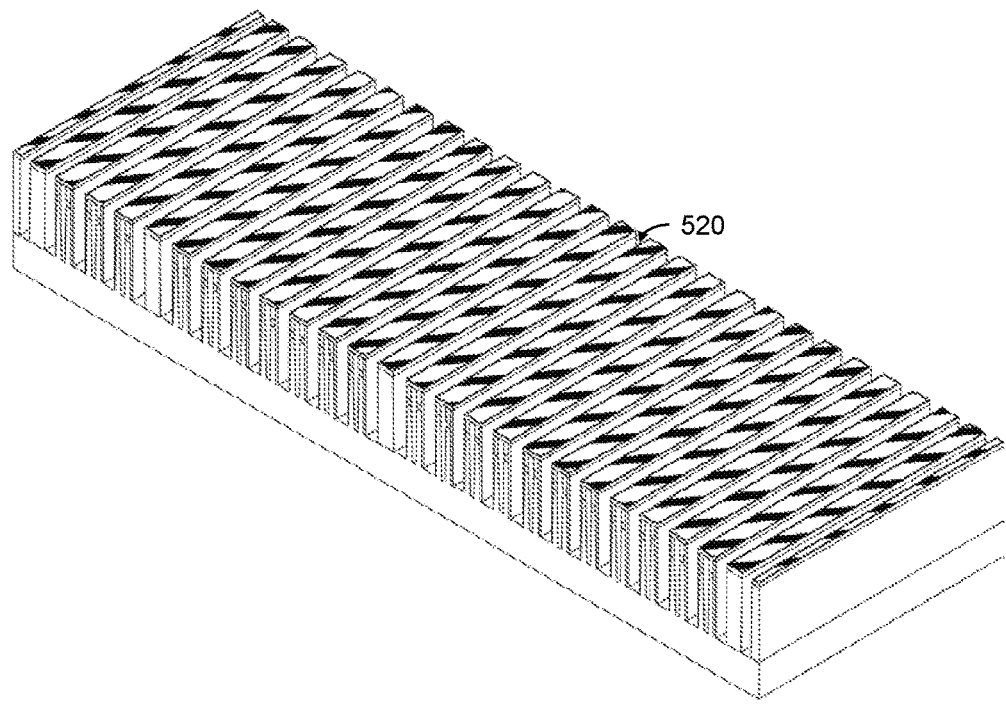

We now refer to FIG. 12. Using now the lines of first phase (620) as an etch mask, the uncovered fins (440) and filling material (220) is removed leaving voids (520).

Figure 13:
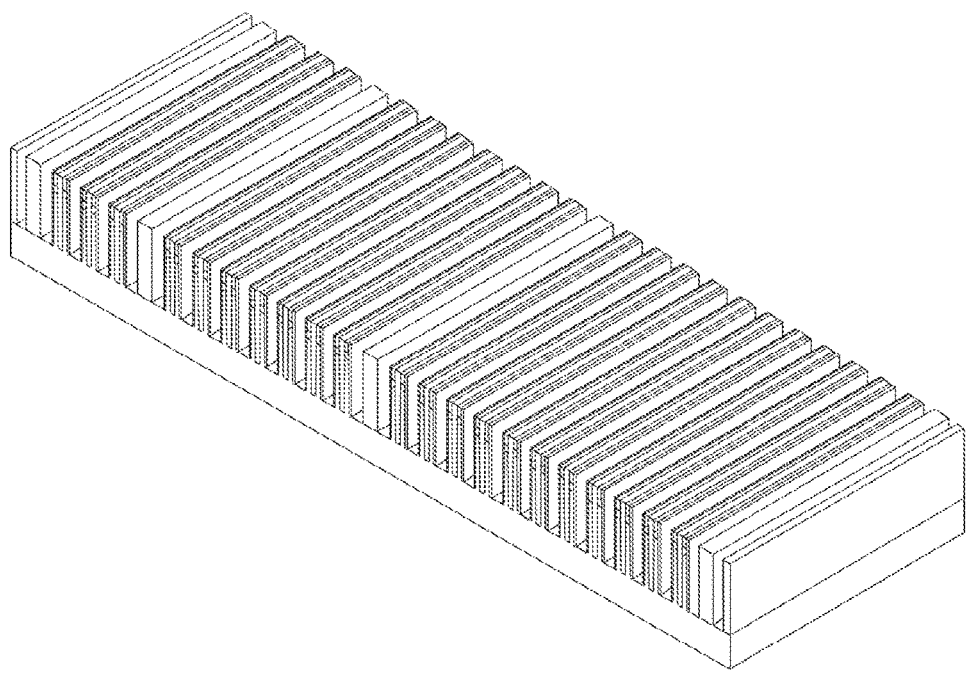

We now refer to FIG. 13. The lines of first phase (620) are removed, selectively with respect to the filling material (220) and the fins (430).

Figure 14:
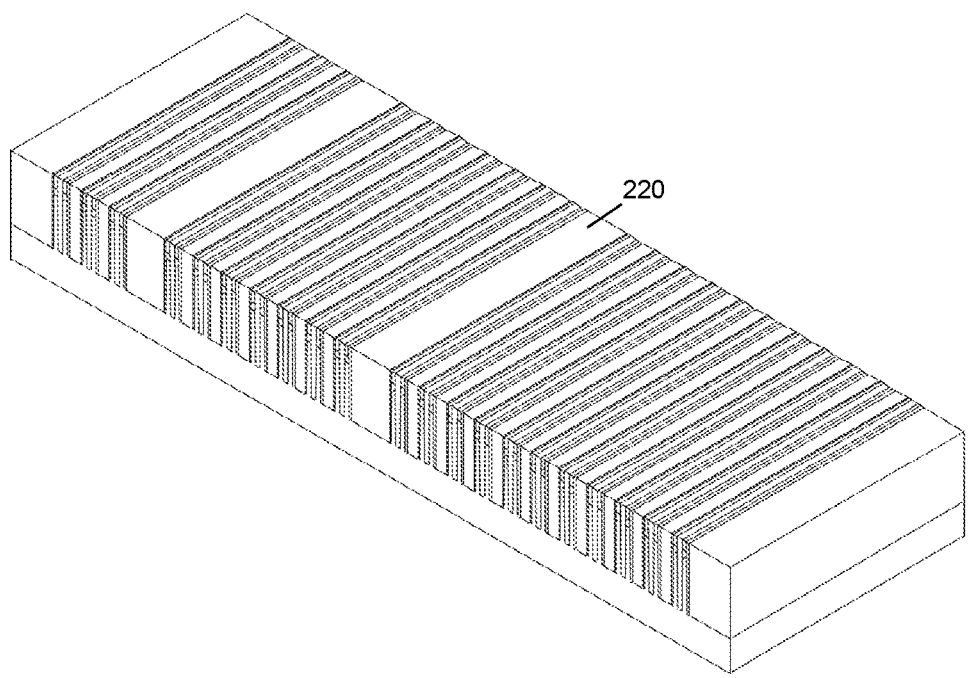

We now refer to FIG. 14. The voids that are obtained by the removal in FIG. 12 are filled up with the filling material (220). Subsequently, some embodiments may again involve a planarization using CMP.

Figure 15:
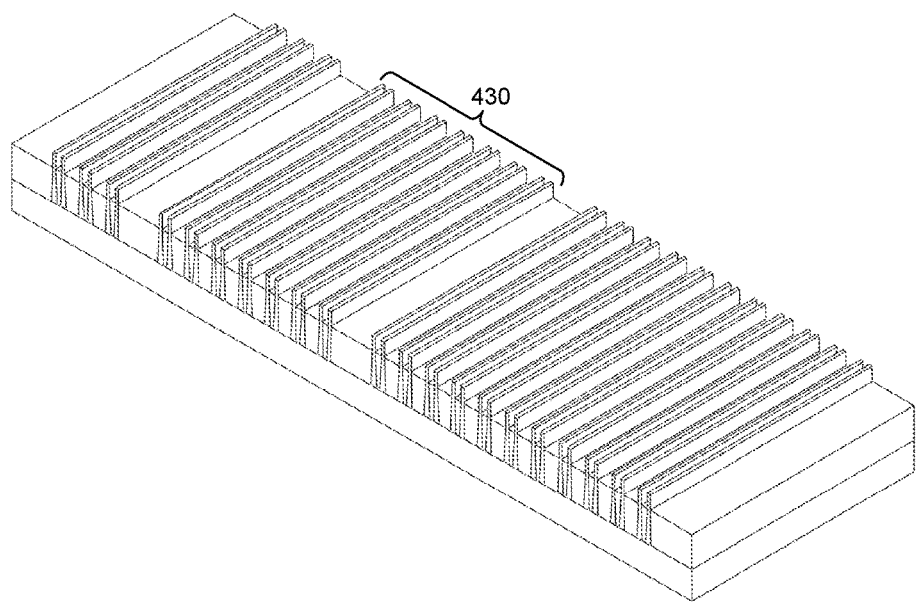

We now refer to FIG. 15. The filling material (220) is etched back so as to partially expose the fins (430). The pattern of fins (430) obtained differs from that in example 1 in that only two in every three fins (430) remains. The fins (430) can again be further processed (not shown) as explained in example 1.

It should additionally be noted that a combination of two or more of these examples can be practiced on different groups of fins on the same substrate, so that a plurality of groups with a different period can be obtained on the same substrate.

It is to be understood that although some embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for selectively removing at least one fin or fin section from a pattern of parallel fins in a semiconductor structure, comprising:
providing a substrate having a pattern of parallel fins thereon, the pattern of parallel fins having a first pitch, the fins having co-planar top surfaces and being separated by a filling material having a top surface coplanar with the co-planar top surfaces of the fins;
providing through directed self-assembly a layer of self-assembled block copolymer covering the co-planar top surfaces of the fins and of the filling material, the self-assembled block copolymer comprising a regular pattern of parallel lines of a first phase alternating with parallel lines of a second phase, the regular pattern of parallel lines of the first and second phase having a second pitch equal to an integer multiple of the first pitch, the parallel lines of the first phase and the parallel lines of the second phase each being at least as wide as the co-planar top surfaces of the fins and being parallel to the fins;
removing the parallel lines of the first phase selectively with respect to the parallel lines of the second phase, thereby uncovering the co-planar top surfaces of the at least one fin or fin section to be removed and the top surface of some of the filling material; and
etching away the at least one uncovered fin or fin section and the uncovered filling material by using the parallel lines of the second phase as a mask, thereby leaving voids where the at least one uncovered fin or fin section and the uncovered filling material was present.

2. The method according to claim 1, wherein the block copolymer comprises a poly(styrene-block-methyl methacrylate).

3. The method according to claim 1, wherein providing through directed self-assembly a layer of self-assembled block copolymer covering the top surfaces of the fins and of the filling material comprises inducing a phase separation of the first and second phase.

4. The method according to claim 1, further comprising selectively removing at least one complete fin from the pattern of parallel fins in the semiconductor structure.

5. The method according to claim 1, wherein one of the first and second phase has a preferential wetting affinity for the co-planar top surface of the fins.

6. The method according to claim 1, wherein one of the first or second phase has a preferential wetting affinity for the top surface of the filling material.

7. The method according to claim 1, wherein the pattern of parallel lines of the first and second phase is aligned to the pattern of parallel fins.

8. The method according to claim 1, wherein the pattern of parallel fins consists of an odd number of fins.

9. The method according to claim 1, wherein the fins comprise a semiconductor material.

10. The method according to claim 1, wherein the fins comprise a hardmask material.

11. The method according to claim 1, further comprising the steps of:
removing the parallel lines of the second phase selectively with respect to the filling material and the fins; and
filling the voids with a filling material such that the filling material has a top surface coplanar with the co-planar top surfaces of the fins.

12. The method according to claim 11, further comprising etching back selectively a top portion of the filing material, thereby exposing part of one or more sidewalls of the fins.

13. A method comprising:
providing a substrate having fins thereon, wherein the fins are arranged in a pattern of fins, the fins having co-planar top surfaces and being separated by a filling material having a top surface coplanar with the co-planar top surfaces of the fins;
depositing a layer of self-assembled block copolymer on the top surface of the fins and of the filling material;
inducing a phase separation between a first phase and a second phase of the self-assembled block copolymer, wherein, subsequent to the phase separation, the layer of self-assembled block copolymer comprises a regular pattern of lines of the first phase alternating with lines of the second phase, wherein the first and second phase are aligned to the pattern of fins;
selectively removing the first phase from the top surfaces of the fins and the filling material so as to form an uncovered portion of the fins and an uncovered portion of the filling material;
etching the uncovered portion of the fins and uncovered filling material to form voids;
removing the second phase; and
filling the voids with further filling material.

14. The method according to claim 13, wherein the self-assembled block copolymer comprises a poly(styrene-block-methyl methacrylate).

15. The method according to claim 13, wherein one of the first and second phase has a preferential wetting affinity for the co-planar top surfaces of the fins.

16. The method according to claim 13, wherein the fins comprise a semiconductor material.

17. The method according to claim 13, wherein the fins comprise a hardmask material.

18. The method according to claim 13, wherein the pattern of fins consists of an odd number of fins.

* * * * *